United States Patent
Yuan et al.

(10) Patent No.: US 8,301,961 B2
(45) Date of Patent: Oct. 30, 2012

(54) DECODING METHOD FOR LOW DENSITY GENERATOR MATRIX CODE

(75) Inventors: Zhifeng Yuan, Shenzhen (CN); Jun Xu, Shenzhen (CN); Jin Xu, Shenzhen (CN)

(73) Assignee: ZTE Corporation (CN)

( * ) Notice: Subject to any disclaimer, the term of this patent is extended or adjusted under 35 U.S.C. 154(b) by 396 days.

(21) Appl. No.: 12/747,936

(22) PCT Filed: Apr. 30, 2008

(86) PCT No.: PCT/CN2008/070858
§ 371 (c)(1),
(2), (4) Date: Jun. 14, 2010

(87) PCT Pub. No.: WO2009/076800
PCT Pub. Date: Jun. 25, 2009

(65) Prior Publication Data
US 2010/0275091 A1    Oct. 28, 2010

(30) Foreign Application Priority Data

Dec. 14, 2007 (CN) .......................... 2007 1 0195761

(51) Int. Cl.
*H03M 13/00* (2006.01)
(52) U.S. Cl. ........................ 714/752; 714/786
(58) Field of Classification Search .................. 714/752, 714/786
See application file for complete search history.

(56) References Cited

U.S. PATENT DOCUMENTS

| | | | |
|---|---|---|---|
| 2004/0054959 A1* | 3/2004 | Blankenship et al. | 714/800 |
| 2005/0154958 A1* | 7/2005 | Xia et al. | 714/752 |
| 2005/0216820 A1* | 9/2005 | Ha et al. | 714/800 |
| 2007/0011569 A1* | 1/2007 | Vila Casado et al. | 714/758 |
| 2007/0245211 A1 | 10/2007 | Kim et al. | |
| 2009/0158117 A1* | 6/2009 | Eroz et al. | 714/752 |

FOREIGN PATENT DOCUMENTS

| | | |
|---|---|---|
| CN | 1756090 A | 4/2006 |
| CN | 1855730 A | 11/2006 |
| WO | 2007075043 A2 | 7/2007 |

\* cited by examiner

*Primary Examiner* — Yolanda L Wilson
(74) *Attorney, Agent, or Firm* — Brooks Kushman P.C.

(57) ABSTRACT

The present invention provides a method for decoding a low density generator matrix code (LDGC), applied for decoding transmitted original information bits encoded in LDGC code. The method comprises the following steps: A: deleting a part erased by a channel in a received code word sequence R filled by a known bit sequence to obtain an erased code word sequence Re, and deleting the rows corresponding to the erased part from a transposed matrix $G_{ldgct}$ of a generator matrix of the LDGC to obtain the erased generator matrix $G_e$; B: permuting columns of $G_e$ such that an M-order square matrix with an element in the $0^{th}$ row and $0^{th}$ column being a vertex is a triangular matrix to obtain the permuted generator matrix $G_f$; and C: calculating the original information bits using $G_f$ and $R_e$.

22 Claims, 4 Drawing Sheets

$$\begin{matrix} x & 0 & 0 & \cdots & 0 \\ x & x & 0 & \cdots & 0 \\ x & x & x & \cdots & 0 \\ \cdots & \cdots & \cdots & \cdots & \cdots \\ x & x & x & x & x \\ y & y & y & y & y \\ \cdots & \cdots & \cdots & \cdots & \cdots \\ y & y & y & y & y \end{matrix}$$

$G_{lgdct}$

FIG. 1

DECODING METHOD FOR LOW DENSITY GENERATOR MATRIX CODE

TECHNICAL FIELD

The present invention relates to the field of data encoding and decoding, and more particularly, to a method for decoding a low density generator matrix code.

TECHNICAL BACKGROUND

Erasure channel is an important channel model. During data transmission, if an error occurs in check of a data packet received by a receiver, then erroneous data segments will be discarded, i.e., erased. Transmitting files over the Internet is a mode of communication by data packet. Generally, each data packet is either received by the receiver correctly or not received by the receiver at all. In the transmission control protocol (TCP), error detection and retransmission mechanism is adopted against packet loss in network, that is, feedback channel from an input terminal to an output terminal is used to control data packets that are required to be retransmitted. When the receiver detects packet loss, it generates a retransmission control signal until a complete data packet is received; and when the receiver receives the data packet, it also generates a receiving acknowledgement signal. A sender, on the other hand, tracks each data packet until the fed back acknowledgement signal is received, otherwise the acknowledgement signal will be retransmitted.

A data broadcast service based on streaming mode and file downloading mode is a point-to-multipoint service, in which feedback is not allowed and traditional error detection and retransmission mechanism cannot be used, and forward error correction (FEC) is required to be used to ensure reliable transmission of data. The FEC in a classical application layer includes Reed-Solomon (RS) codes and digital fountain codes. The RS codes with higher encoding and decoding complexity typically apply to only cases where code length is smaller. Luby transform (LT) codes and Raptor codes are two types of practically applicable digital fountain codes. The LT codes have linear encoding and decoding time, which is an essential improvement as compared to the RS codes, and the Raptor codes use pre-encoding technology and thus have higher encoding efficiency. The multimedia broadcast/multicast service (MBMS) and digital video broadcasting (DVB) of the $3^{rd}$ Generation Partnership Project (3GPP) uses the Raptor codes from Digital Fountain Company as their FEC encoding scheme.

If the first k bits of the encoded code word are the same as information bits, then the code is called a system code. The encoding process is a process where the K information bits generate a code length with N bits, and N-K check bits are added in order to achieve error detection and correction. The LT codes do not support the encoding mode of the system code, thus it is difficult for the LT codes to satisfy certain actual FEC coding requirements. The Raptor codes support the system code; however, the Raptor codes need an individual pre-encoding process, i.e., a pre-encoding matrix, thus the encoding is more complex.

In order to eliminate the disadvantages of the encoding method described above, a low density generator matrix code (LDGC) is introduced. The LDGC is a linear block code and non-zero elements in its generator matrix (encoding matrix) are generally sparse. In addition, the LDGC is also a system code.

FIG. 1 illustrates a schematic diagram of a generator matrix of the LDGC. As shown in FIG. 1, a square matrix corresponding to the first L rows in the generator matrix $G_{Igdc}$ of the LDGC is typically an upper triangular matrix or a lower triangular matrix, and its matrix inversion may be implemented by an iterative method. x and y in FIG. 1 may be 0.

The encoding of the LDGC is to get an intermediate variable at first using a corresponding relationship between the information bits (data to be transmitted) and the intermediate variable in a system code and then to obtain an encoded code word by multiplying a generator matrix by the intermediate variable. Specifically, the encoding process is to fill d=L-K known bits in a K-bit information sequence m to generate a L-bit sequence s, then generate an L-bit intermediate variable sequence I according to an equation: $I \times G_{Idgc}(0:L-1, 0:L-1)=$ s, and then generate a N-bit code word sequence $C_{Idgc}$ from the L-bit intermediate variable sequence I. After $C_{Idgc}$ passes through a channel, a code word sequence R is received by a receiver. For the detailed encoding process, we may refer to a patent entitled "An encoding method and apparatus and a decoding method and apparatus of low density generator matrix codes", where I is a vector of 1*L and $G_{Idgc}(0:L-1, 0:N+d-1)$ is a matrix with L*(N+d).

The decoding process of the LCGC is to get the intermediate variable using the generator matrix and then get the information bit based on a transformation relation between the information bits and the intermediate variable. When solving the intermediate variable, the most critical step is to carry out Gaussian elimination, and the speed of the Gaussian elimination affects directly the decoding speed of the LDGC. According to decoding requirements, $G_{Idgct}$ is defined as the transpose of $G_{Idgc}$, $I_t$ is defined as the transpose of I and the received sequence R is defined as a column vector.

In the process of acquiring the intermediate variable $I_t$ based on a relation formula $G_{Idgct} \times I_t = R$ in decoding, the following three elementary transformations should be performed for $G_{Idgct}$:

1) row permutation: if the $i^{th}$ row is permuted by the $j^{th}$ row of $G_{Idgct}$, then the $i^{th}$ bit is needed to be permuted by the $j^{th}$ bit of R;
2) row addition: if the $i^{th}$ row is added to the $j^{th}$ row of $G_{Idgct}$, then the $i^{th}$ bit is needed to be added to the $j^{th}$ bit of R (modulus 2 is added); and
3) column permutation: if the $i^{th}$ column is permuted by the $j^{th}$ column of $G_{Idgct}$, then the $i^{th}$ bit is needed to be permuted by the $j^{th}$ bit of R.

The decoding of the LDGC uses a standard Gaussian elimination method in prior art such that the efficiency of the decoding is lower.

SUMMARY OF THE INVENTION

A technical problem to be solved by the present invention is to provide a method for decoding the LDGC with high efficiency to overcome the deficiency of prior art.

In order to solve the technical problems described above, the present invention provides a method for decoding a low density generator matrix code (LDGC) so as to decode transmitted original information bits encoded in LDGC code. The method comprises the following steps:

A: deleting a part erased by a channel in a received code word sequence R filled by a known bit sequence to obtain an erased code word sequence Re, and deleting the rows corresponding to the erased part from a transposed matrix $G_{Idgct}$ of a generator matrix of the LDGC to obtain an erased generator matrix $G_e$;

B: permuting columns of $G_e$ such that an M-order square matrix with an element in the $0^{th}$ row and $0^{th}$ column being a vertex is a triangular matrix to obtain a permuted generator matrix $G_f$; and C: calculating the original information bits using $G_f$ and $R_e$.

Further, the method may also be characterized in that $G_{Idgct}$, $G_e$ and $G_f$ are matrices with L columns and M=L−NE, with NE being the number of bits erased by the channel in R.

Further, the method may also be characterized in that it comprises the following step between the step B and C: determining whether $G_f$ is a full rank matrix, and performing the step C if $G_f$ is a full rank, otherwise decoding fails and the method ends.

Further, the method may also be characterized in that whether or not $G_f$ is a full rank matrix is determined by determining whether the rank of a matrix $G_{part}$ composed by the $H^{th}$ row to the last row and the $H^{th}$ column to the last column in $G_f$ equals to L−H, where H is the first erased part in R.

Further, the method may also be characterized in that the step C comprises following sub-steps:

C1: obtaining an intermediate permutation variable $I_l$ based on a relation formula $G_f \times I_l = R_e$;

C2: obtaining an intermediate variable $I_t$ by rearranging $I_l$ based on permutation relation between columns of $G_e$ and $G_f$; and C3: obtaining a bit sequence s based on a relation formula $I_t \times C_{Idgct}(0:L-1, 0:L-1)=s$ and deleting the filled known bits to obtain the original information bits.

Further, the method may also be characterized in that in the step C1, $I_l$ is obtained using a Gaussian elimination method.

Further, the method may also be characterized in that:
in the step B, corresponding elements in an array $I_{tmp}$ with a length being L and an initial value being [0, 1, 2, ..., L−1] is permuted while permuting the columns of $G_e$; and
in the step C2, the intermediate variable $I_t$ is obtained by rearranging $I_l$ based on $I_{tmp}$.

Further, the method may also be characterized in that the M-order square matrix is a lower triangular matrix or an upper triangular matrix.

Further, the method may also be characterized in that the generator matrix $G_{Idgct}$ of the LDGC is a sparse matrix with N rows and L columns; a square matrix corresponding to the first L rows of $G_{Idgct}$ is a lower triangular matrix or the square matrix may be transformed to a lower triangular matrix; N>L; or a square matrix corresponding to the first L rows of $G_{Idgct}$ is an upper triangular matrix or the square matrix may be transformed to a upper triangular matrix.

Further, the method may also be characterized in that: in the step B, based on the deleted row serial numbers, shifting columns with column serial numbers being the same as the row serial numbers in $G_e$ to the last NE columns of the matrix, the original positions of the columns are filled by corresponding subsequent columns successively.

Using the method for decoding the LDGC in accordance with the present invention, diagonalization feature of a structured coding matrix of the LDGC may be fully utilized as compared to the decoding method using the Gaussian elimination directly so as to decrease greatly the complexity of the decoding and accelerate the speed of the decoding such that the LDGC may be applied to an high-speed communication system.

BRIEF DESCRIPTION OF THE DRAWINGS

FIG. 1 is a schematic diagram of a generator matrix of the LDGC;

PREFERRED EMBODIMENTS OF THE INVENTION

The basic idea of the present invention is to use diagonalization feature of a structured generator matrix of the LDGC to permute columns of the erased generator matrix such that an M-order square matrix with (0, 0), i.e., an element in the $0^{th}$ row and $0^{th}$ column being a vertex is a lower triangular matrix.

The present invention will be described in detail below in conjunction with the accompanying drawings and specific embodiments.

Figure 2:
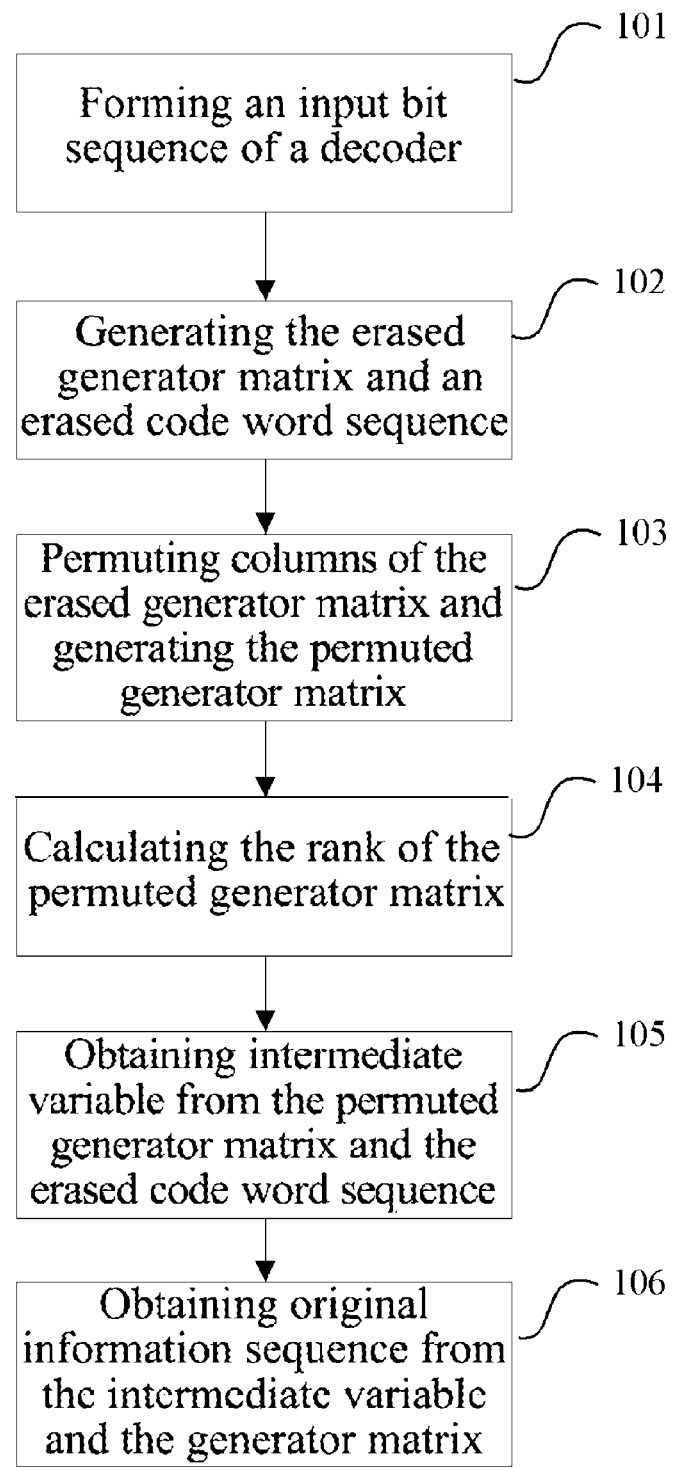
FIG. 2 is a flow chart of a decoding method of the low density generator matrix code in accordance with the present invention.

FIG. 2 is a flow chart of a decoding method of the low density generator matrix code in accordance with the present invention. As shown in FIG. 2, the method comprises the following steps:

101: a known sequence with a length of d=L−K, such as 1, 1, ..., 1, is added after a received bit signal stream transmitted via an erasure channel to form an input bit sequence R of a decoder, where K is the length of original information bits and L is the coding length of the filled original information bits.

102: the corresponding row of the generator matrix $G_{Idgct}$ of the LDGC is erased (deleted) according to conditions of erasing the received code word sequence to obtain the erased generator matrix $G_e$ and an erased code word sequence $R_e$.

Figure 3:
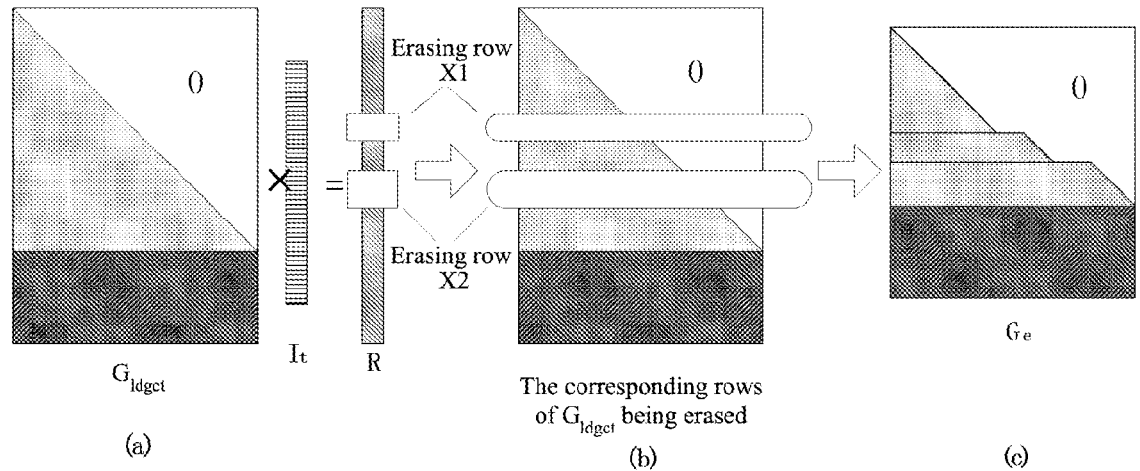
FIG. 3 is a schematic diagram of erasing the generator matrix according to conditions of erasing the received code word sequence.

FIG. 3 is a schematic diagram of erasing the generator matrix according to conditions of erasing the received code word sequence. As shown in FIG. 3, the first L rows of the erased generator matrix $G_e$ is no longer a lower triangular square matrix.

Assuming that the symbols $\{r_i, r_{i+1}, ..., r_{i+x1}\}$ and $\{r_j, r_{j+1}, ..., r_{j+x2}\}$ in R ($r_0, r_1, ..., r_{N-1}$) are erased by a channel, the {i, i+1, ..., i+x1}-th rows and {j, j+1, ..., j+x2}-th rows in $G_{Idgct}$ are needed to be erased to obtain $G_e$. At this point because a number of rows in upper part of $G_e$ are erased, $G_e$ is no longer strictly diagonalized, as shown in FIG. 3(c).

In the same time, the erased symbols $\{r_i, r_{i+1}, ..., r_{i+x1}\}$ and $\{r_j, r_{j+1}, ..., r_{j+x2}\}$ in R are needed to be deleted and their corresponding positions are filled by subsequence symbols in R successively to obtain the erased code word sequence $R_e$.

103: columns of the erased generator matrix $G_e$ is permuted such that an M-order square matrix with (0, 0) being a vertex in $G_e$ is a lower triangular matrix, where M=L−NE, with NE being the total number of the erased rows.

Figure 4:
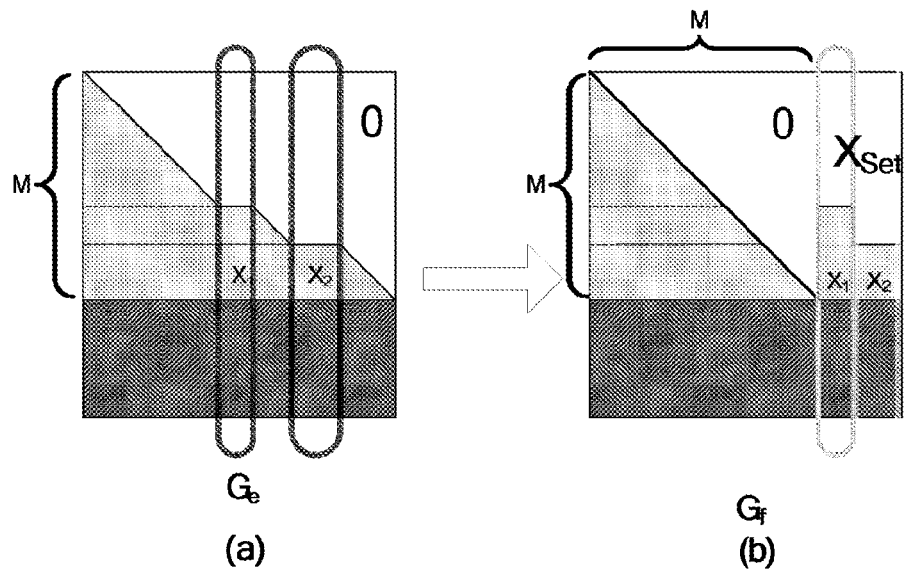
FIG. 4 is a schematic diagram of permuting columns of the erased generator matrix $G_e$.

FIG. 4 is a schematic diagram of permuting the columns of the erased generator matrix $G_e$.

As shown in FIG. 4, assuming again that the erased symbols in R are $\{r_i, r_{i+1}, ..., r_{i+x1}\}$ and $\{r_j, r_{j+1}, ..., r_{j+x2}\}$ and X1+X2=NE.

A set of the erased row indices is $X_{set}$={i, i+1, ..., i+x1, j, j+1, ..., j+x2}.

In order to get a lower triangular matrix, the columns of $G_e$ are permuted, the columns with column serial numbers belonging to $X_{set}$ in $G_e$ are shifted to the rightmost of $G_e$, and the vacated positions of the corresponding columns are filled by the subsequent columns with column serial numbers not belonging to $X_{set}$ to obtain the permuted generator matrix $G_f$.

In order to record the permutation of $I_t$ for recovery, an array $I_{tmp}$ with a length of L is needed to be configured. $I_{tmp}$ may be initialized to be [0, 1, 2, ..., L−1] or other values, which are not be limited herein. As the permutation is performed, elements of the array $I_{tmp}$ are permutated accordingly, that is, the {i, i+1, ..., i+x1, j, j+1, ..., j+x2}-th elements in $I_{tmp}$ are shifted to the end of $I_{tmp}$.

As shown in FIG. 4, the M-order square matrix with (0, 0) being a vertex in the $G_e$ with columns being permuted is a lower triangular matrix, where M=L−NE and NE=X1+X2. This feature may allow computation to be reduced in subsequent decoding using the Gaussian elimination method, thereby improving greatly operation speed.

104: the rank of $G_f$ is calculated to determine whether it is a full rank matrix.

Since the upper left part of $G_f$ is a lower triangular, the first erased row in $G_{Idgct}$ is noted as the $H^{th}$ row, and the $0^{th}$ to $(H-1)^{th}$ rows in $G_f$ must be linearly independent. Thus, we only need to determine whether the rank of a matrix $G_{part}$ composed by the $H^{th}$ row to the last row and the $H^{th}$ column to the last column in $G_f$ equals to L−H. If the rank of $G_{part}$ equals to L−H, then this shows that $G_f$ is a full rank matrix.

Figure 5:
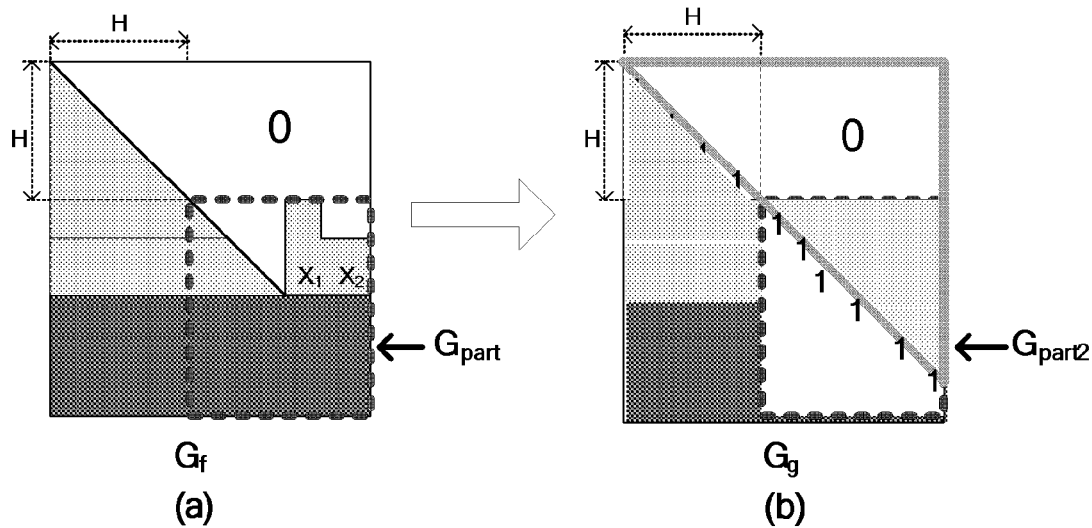
FIG. 5 and FIG. 6 are schematic diagrams of determining whether the generator matrix with the columns being permuted is a full rank matrix and performing Gaussian elimination for the same.

FIG. 5 is a schematic diagram of determining whether the generator matrix with the columns being permuted is a full rank matrix and performing Gaussian elimination for the same.

$G_{part}$ may be represented as $G_f$ (H: N−H, H: L), i.e., a matrix corresponding to an area enclosed by thick dashed line in FIG. 5. The rank of $G_{part}$ may be determined by performing Gaussian elimination for $G_{part}$. After the Gaussian elimination is completed, $G_{part}$ is converted into a matrix $G_{part2}$ with an upper triangular shape if the rank of $G_{part}$ equals to L−H. The step described above make the matrix $G_f$ to be converted into the matrix $G_g$.

105: if $G_f$ is a full rank matrix (i.e., the rank of $G_{part}$ is L−H), an intermediate permutation variable $I_i$ is obtained using the Gaussian elimination method based on a relation formula $G_f \times I_i = R_e$ and an intermediate variable $I_t$ is obtained based on $I_i$ and $I_{tmp}$.

In the step 104, because $G_{part}$ is transformed to an upper triangular shape such that the matrix $G_f$ is converted into the matrix $G_g$, the Gaussian elimination is required to performed on only the $0^{th}$ to the $(H-1)^{th}$ columns.

Figure 6:
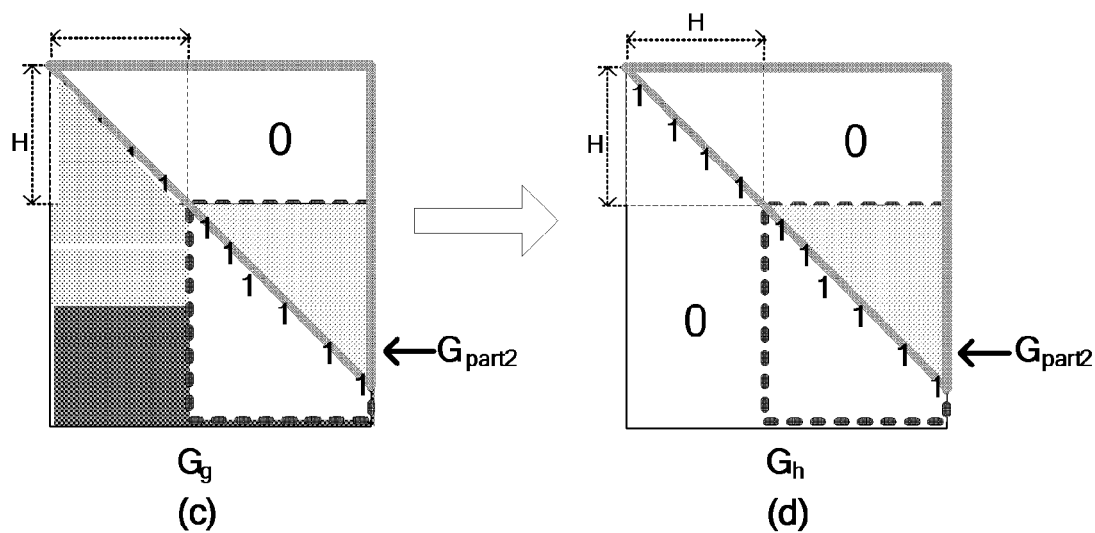

As shown in FIG. 6, the Gaussian elimination is performed on only the $0^{th}$ to the $(H-1)^{th}$ columns in $G_g$ to obtain $G_h$ with an upper triangular shape. The intermediate permutation variable $I_i$ may be solved out based on the upper triangular shape of $G_h$. Further, $I_i$ may be inversely permuted to obtain $I_t$ based on the array $I_{tmp}$ recorded in the step 103.

106: a bit sequence s is obtained based on a relation formula $I \times G_{Idgct}(0:L-1, 0:L-1) = s$ used in encoding and the d=L−K filled bits are deleted from the bit sequence s to obtain an original information sequence m.

It can be seen from the above that using the decoding method in accordance with the present invention for the generator matrix of the LDGC may improving processing speed of the Gaussian elimination and the Gaussian elimination is not required to be performed on the entire permuted generator matrix $G_f$ in determining whether it is a full rank matrix, thereby improving the speed of full rank determination. Thus, the case where the matrix is not a full rank and can not be decoded correctly may be discovered in time and processed accordingly.

According to basic principles of the present invention, the above embodiment may also have various transform modes.

(1) In the step 103, the columns with column serial numbers belonging to the set $X_{set}$ are shifted to the rightmost of $G_e$, and each column is shifted to the right by one column or a plurality of columns according to the situation.

(2) For a generator matrix of LDGC with other shapes, for example, a generator matrix with the first L rows being an upper triangular matrix, the decoding method in accordance with the present invention may be used after it is converted into a lower triangular matrix.

(3) If the first L rows of the generator matrix of the LDGC are an upper triangular matrix, columns of the erased generator matrix $G_e$ may be permuted such that the M-order square matrix with (0, 0) being a vertex in $G_e$ is an upper triangular matrix to obtain the permuted generator matrix $G_f$, where M=L−NE, with NE being the total number of the erased rows. In addition, the intermediate permutation variable $I_i$ is obtained using $G_f \times I_i = R_e$ to get the original information bits. If the first L rows of the generator matrix of the LDGC are not an upper triangular matrix, it may be decoded after converted into an upper triangular matrix.

(4) The corresponding permuted generator matrix may be generated based on an initial generator matrix. If the initial generator matrix is a lower triangular matrix, then the permuted M-order square matrix with (0, 0) being a vertex is an upper triangular matrix, where M=L−NE, with NE being the total number of the erased rows. That is, it is sufficient that the M-order square matrix is a triangular matrix. The erased generator matrix is permuted to obtain the M-order square matrix with (0, 0) being a vertex, which is an upper triangular matrix, and then the steps 104-106 are performed to obtain the original information bits.

All of the above are only embodiments of the present invention and are not intended to limit the present invention. A variety of modifications and variations may be made to the present invention by those skilled in the art. Any modification, equivalent replacement and improvement made within the sprit and principle of the present invention should be included in the scope defined by claims of the present invention.

INDUSTRIAL APPLICABILITY

In view of the above, using the decoding method in accordance with the present invention for the generator matrix of the LDGC may improving processing speed of the Gaussian elimination and the Gaussian elimination is not required to be performed on the entire permuted generator matrix $G_f$ in determining whether it is a full rank matrix, thereby improving the speed of full rank determination. Thus, the case where the matrix is not a full rank and can not be decoded correctly may be discovered in time and processed accordingly.

What we claim is:

1. A method for decoding a low density generator matrix code (LDGC), applied for decoding transmitted original information bits encoded in LDGC, the method comprising the following steps of:

A: deleting a part erased by a channel in a received code word sequence R filled by a known bit sequence to obtain an erased code word sequence $R_e$, and deleting the rows corresponding to the erased part from a transposed matrix $G_{Idgct}$ of a generator matrix of the LDGC to obtain an erased generator matrix $G_e$;

B: permuting columns of $G_e$ such that an M-order square matrix with an element in the $0^{th}$ row and $0^{th}$ column being a vertex is a triangular matrix to obtain a permuted generator matrix $G_f$; and C: calculating the original information bits using $G_f$ and $R_e$.

2. The method according to claim 1, wherein $G_{Idgct}$, $G_e$ and $G_f$ are matrices with L columns and M=L−NE, with NE being the number of bits erased by the channel in R.

3. The method according to claim 2, further comprising the following step between the step B and C: determining whether $G_f$ is a full rank matrix, and performing the step C if $G_f$ is a full rank, otherwise decoding fails and the method ends.

4. The method according to claim 3, wherein whether or not $G_f$ is a full rank matrix is determined by determining whether the rank of a matrix $G_{part}$ composed by the $H^{th}$ row to the last row and the $H^{th}$ column to the last column in $G_f$ equals to L−H, where H is the first erased part in R.

5. The method according to claim 4, wherein in the step B, the M-order square matrix is a lower triangular matrix or an upper triangular matrix.

6. The method according to claim 5, wherein the generator matrix $G_{Idgct}$ of the LDGC is a sparse matrix with N rows and L columns; a square matrix corresponding to the first L rows of $G_{Idgct}$ is a lower triangular matrix or the square matrix may be transformed to a lower triangular matrix; N>L; or a square matrix corresponding to the first L rows of $G_{Idgct}$ is an upper triangular matrix or the square matrix may be transformed to a upper triangular matrix.

7. The method according to claim 3, wherein in the step B, the M-order square matrix is a lower triangular matrix or an upper triangular matrix.

8. The method according to claim 7, wherein the generator matrix $G_{Idgct}$ of the LDGC is a sparse matrix with N rows and L columns; a square matrix corresponding to the first L rows of $G_{Idgct}$ is a lower triangular matrix or the square matrix may be transformed to a lower triangular matrix; N>L; or a square matrix corresponding to the first L rows of $G_{Idgct}$ is an upper triangular matrix or the square matrix may be transformed to a upper triangular matrix.

9. The method according to claim 2, wherein the step C comprises following sub-steps:
C1: obtaining an intermediate permutation variable $I_l$ based on a relation formula $G_f \times I_l = R_e$;
C2: obtaining an intermediate variable $I_t$ by rearranging $I_l$ based on permutation relation between columns of $G_e$ and $G_f$; and
C3: obtaining a bit sequence s based on a relation formula It×$C_{Idgct}$(0: L−1, 0: L−1)=s and deleting the filled known bits to obtain the original information bits.

10. The method according to claim 9, wherein in the step $C_1$, $I_l$ is obtained using a Gaussian elimination method.

11. The method according to claim 10, wherein in the step B, the M-order square matrix is a lower triangular matrix or an upper triangular matrix.

12. The method according to claim 11, wherein the generator matrix $G_{Idgct}$ of the LDGC is a sparse matrix with N rows and L columns; a square matrix corresponding to the first L rows of $G_{Idgct}$ is a lower triangular matrix or the square matrix may be transformed to a lower triangular matrix; N>L; or a square matrix corresponding to the first L rows of $G_{Idgct}$ is an upper triangular matrix or the square matrix may be transformed to a upper triangular matrix.

13. The method according to claim 9, wherein, in the step B, corresponding elements in an array Itmp with a length being L and an initial value being [0, 1, 2, ..., L−1] is permuted while permuting the columns of $G_e$; and in the step C2, the intermediate variable $I_t$ is obtained by rearranging $I_l$ based on $I_{tmp}$.

14. The method according to claim 13, wherein in the step B, the M-order square matrix is a lower triangular matrix or an upper triangular matrix.

15. The method according to claim 14, wherein the generator matrix $G_{Idgct}$ of the LDGC is a sparse matrix with N rows and L columns; a square matrix corresponding to the first L rows of $G_{Idgct}$ is a lower triangular matrix or the square matrix may be transformed to a lower triangular matrix; N>L; or a square matrix corresponding to the first L rows of $G_{Idgct}$ is an upper triangular matrix or the square matrix may be transformed to a upper triangular matrix.

16. The method according to claim 9, wherein in the step B, the M-order square matrix is a lower triangular matrix or an upper triangular matrix.

17. The method according to claim 16, wherein the generator matrix $G_{Idgct}$ of the LDGC is a sparse matrix with N rows and L columns; a square matrix corresponding to the first L rows of $G_{Idgct}$ is a lower triangular matrix or the square matrix may be transformed to a lower triangular matrix; N>L; or a square matrix corresponding to the first L rows of $G_{Idgct}$ is an upper triangular matrix or the square matrix may be transformed to a upper triangular matrix.

18. The method according to claim 2, further comprising: in the step B, based on the deleted row serial numbers, shifting columns with column serial numbers being the same as the row serial numbers in $G_e$ to the last NE columns of the matrix, the original positions of the columns are filled by corresponding subsequent columns successively.

19. The method according to claim 2, wherein in the step B, the M-order square matrix is a lower triangular matrix or an upper triangular matrix.

20. The method according to claim 19, wherein the generator matrix $G_{Idgct}$ of the LDGC is a sparse matrix with N rows and L columns; a square matrix corresponding to the first L rows of $G_{Idgct}$ is a lower triangular matrix or the square matrix may be transformed to a lower triangular matrix; N>L; or a square matrix corresponding to the first L rows of $G_{Idgct}$ is an upper triangular matrix or the square matrix may be transformed to a upper triangular matrix.

21. The method according to claim 1, wherein in the step B, the M-order square matrix is a lower triangular matrix or an upper triangular matrix.

22. The method according to claim 21, wherein the generator matrix $G_{Idgct}$ of the LDGC is a sparse matrix with N rows and L columns; a square matrix corresponding to the first L rows of $G_{Idgct}$ is a lower triangular matrix or the square matrix may be transformed to a lower triangular matrix; N>L; or a square matrix corresponding to the first L rows of $G_{Idgct}$ is an upper triangular matrix or the square matrix may be transformed to a upper triangular matrix.

* * * * *

UNITED STATES PATENT AND TRADEMARK OFFICE
CERTIFICATE OF CORRECTION

PATENT NO. : 8,301,961 B2
APPLICATION NO. : 12/747936
DATED : October 30, 2012
INVENTOR(S) : Zhifeng Yuan et al.

Page 1 of 1

It is certified that error appears in the above-identified patent and that said Letters Patent is hereby corrected as shown below:

Column 7, Line 44, Claim 9:

Delete "$G_f \times I_1 = R_{ei}$" and replace with -- $G_f \times I_1 = R_{ci}$ --.

Signed and Sealed this
Twenty-sixth Day of March, 2013

Teresa Stanek Rea
*Acting Director of the United States Patent and Trademark Office*